United States Patent
Yang et al.

(10) Patent No.: US 8,910,024 B1
(45) Date of Patent: *Dec. 9, 2014

(54) SYSTEMS AND METHODS FOR ENCODING DATA TO MEET AN OUTPUT CONSTRAINT

(71) Applicant: Marvell International Ltd., Hamilton (BM)

(72) Inventors: Xueshi Yang, Cupertino, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/855,879

(22) Filed: Apr. 3, 2013

Related U.S. Application Data

(63) Continuation of application No. 12/701,895, filed on Feb. 8, 2010, now Pat. No. 8,418,031.

(60) Provisional application No. 61/151,020, filed on Feb. 9, 2009.

(51) Int. Cl.
*H03M 13/00* (2006.01)
*H03M 13/05* (2006.01)

(52) U.S. Cl.
CPC ..................... *H03M 13/05* (2013.01)
USPC ........................................................ 714/774

(58) Field of Classification Search
USPC ........................................................ 714/774
See application file for complete search history.

(56) References Cited

U.S. PATENT DOCUMENTS

| | | | | | |
|---|---|---|---|---|---|
| 3,078,443 | A | * | 2/1963 | Rose | 714/774 |
| 5,579,303 | A | * | 11/1996 | Kiriyama | 370/252 |
| 6,044,485 | A | * | 3/2000 | Dent et al. | 714/774 |

(Continued)

FOREIGN PATENT DOCUMENTS

| | | |
|---|---|---|
| EP | 1 641 187 A1 | 3/2006 |
| EP | 1 750 404 A1 | 2/2007 |

OTHER PUBLICATIONS

IEEE Std 802.15.3c/D00 (Amendment to IEEE Std 802.15.3-2003) "Draft Amendment to IEEE Standard for Information technology—Telecommunications and information exchange between systems—Local and metropolitan area networks—Specific requirements—Part 15.3: Wireless Medium Access Control (MAC) and Physical Layer (PHY) Specifcations for High Rate Wireless Personal Area Networks (WPANs): Amendment 2: Millimeter-wave based Alternative Physical Layer Extension," *The Institute of Electrical and Electronics Engineers, Inc.* (2008).

*Primary Examiner* — Joseph D Torres

(57) ABSTRACT

In a method of encoding data, a data block is received; transformed, error-corrected encoded data blocks based on the received data block are generated and one is selected based on a constraint; and the selected data block is transmitted. The method may include adding, to the received data block, pivot data corresponding to different transformations. In an apparatus, an encoded data generator is configured to generate different encoded data block candidates based on a received data block, and a selector is configured to select one of the candidates to output as encoded data based on a constraint. The encoded data generator may include a transformer configured to apply one or more transformations to the received data block, and an error correction code (ECC) encoder configured to apply error correction to the received data block. The encoded data generator and the selector may be included in a transmitter.

20 Claims, 7 Drawing Sheets

(56) References Cited

U.S. PATENT DOCUMENTS

| | | | |
|---|---|---|---|
| 6,182,264 B1 * | 1/2001 | Ott ............................... | 714/774 |
| 6,201,811 B1 * | 3/2001 | Larsson et al. ............. | 370/310.1 |
| 6,400,728 B1 * | 6/2002 | Ott ............................... | 370/465 |
| 6,665,831 B1 * | 12/2003 | Yoshida et al. ............... | 714/774 |
| 6,735,735 B1 * | 5/2004 | Ohira et al. .................. | 714/776 |
| 6,757,860 B2 * | 6/2004 | Choi et al. .................... | 714/757 |
| 8,418,031 B1 * | 4/2013 | Yang et al. .................... | 714/774 |
| 2005/0249127 A1 | 11/2005 | Huo et al. .................... | 370/252 |

* cited by examiner

SYSTEMS AND METHODS FOR ENCODING DATA TO MEET AN OUTPUT CONSTRAINT

CROSS-REFERENCES TO RELATED APPLICATIONS

The present application is a continuation of U.S. patent application Ser. No. 12/701,895, entitled "Systems and Methods for Encoding Data to Meet an Output Constraint," filed on Feb. 8, 2010, which claims the benefit of U.S. Provisional Application No. 61/151,020, entitled "Methods for Generating ECC Parities with Desired Constraint," filed on Feb. 9, 2009, both of which are hereby incorporated by reference herein in their entireties.

FIELD OF TECHNOLOGY

The present disclosure relates generally to encoding data and, more particularly, to encoding data to meet an output constraint.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In typical communication systems, data storage systems, data transfer systems or other systems that encode and decode data, a transmitting device transmits or transfers data to a receiving device over a channel. Generally, the transmitting device encodes the data using some type of error correction code. Some number of additional bits (e.g., parity bits) may be added to the original data for error correction purposes, and then the encoded data is output by the encoding system to be transmitted or transferred over the channel to the receiving device.

In some cases, channel statistics depend on the data transferred, that is, a channel may prefer one data type over another with respect to optimizing data transmission reliability or channel lifetime. For instance, a flash memory device may prefer a logical bit "1" rather than a logical bit "0." The logical bit "1" may indicate program prohibition, and may translate into less stress during programming and may increase life expectancy for memory cells of the flash memory device.

In other cases, a minimum Hamming weight of an error-corrected code may be desired so that the error-correction has a particular strength. In still other cases, other constraints on the data to be transmitted or transferred may be desired.

SUMMARY

In one embodiment, a method includes receiving a data block, generating a plurality of transformed, error-corrected encoded data blocks based on the received data block, selecting one of the transformed, error-corrected encoded data blocks based on a constraint, and transmitting the selected data block. The received data block may be transformed by adding one or more pivot bits to the received data block, where the pivot bits and their values may correspond to different transformations.

In another embodiment, an error correction encoding apparatus includes an encoded data generator configured to generate a plurality of different encoded candidates for a received data block, and a selector configured to select one of the candidates to output as encoded data based on a constraint. The encoded data generator may include a transformer that applies one or more transformations to the received data block, and an error correction code (ECC) encoder that applies error correction to the received data block.

In yet another embodiment, an apparatus includes a transmitter of encoded data. The transmitter includes an encoded data generator configured to generate a plurality of different encoded candidates based on a received data block, and a selector configured to select one of the candidates to output as encoded data based on a constraint.

DETAILED DESCRIPTION

Figure 1A:
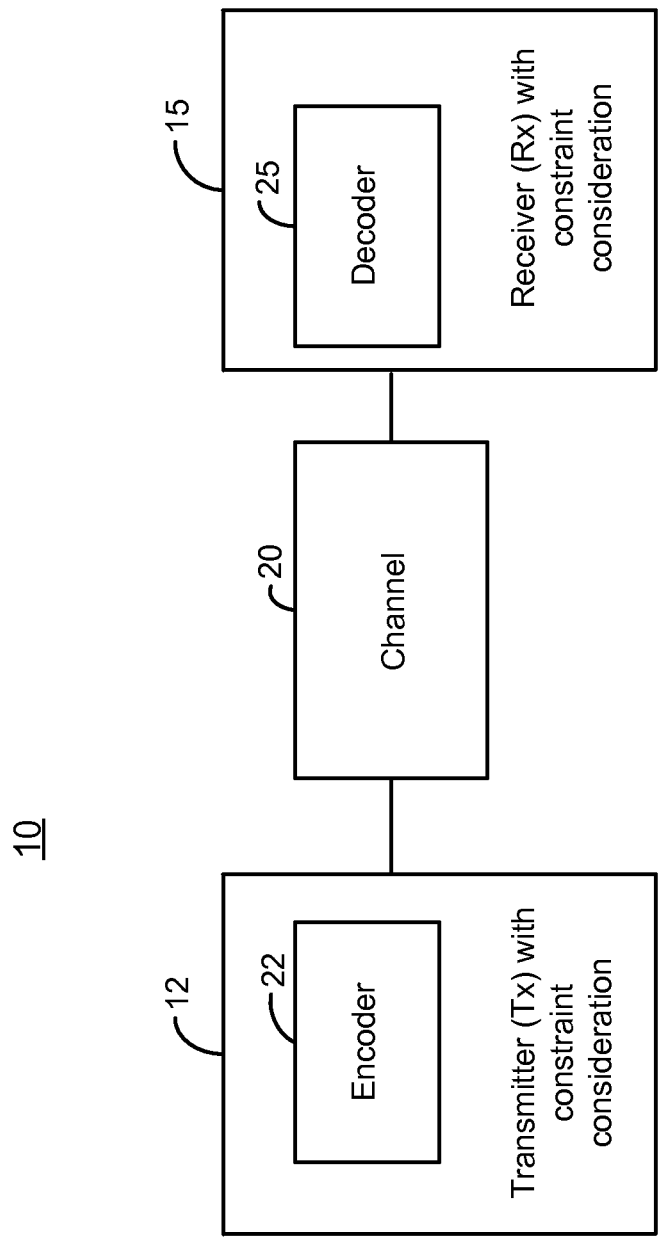
FIG. 1A is a block diagram of an example of a system that encodes data to meet a desired output constraint.

FIG. 1A is a block diagram of an example of a system 10 in which data is encoded to meet a desired output constraint. The system 10 includes, for example, a transmitter or transmitting device 12 and a receiver or receiving device 15. The transmitter 12 and the receiver 15 are coupled together via a channel (also referred to as a data channel) 20 over or on which data may be transmitted or transferred. The transmitter 12 receives data that is to be communicated, and an encoder 22 at the transmitter 12 encodes the data into some form of error-corrected code. The error-corrected code is then delivered to the receiver 15 via the channel 20. The error-corrected code is received from the channel 20 by the receiver 15, and a decoder 25 decodes the error-corrected code to recover the data.

In some embodiments, the system 10 can be a wired communication system, a wireless communications system, or some combination of the two. For example, if the system 10 is a wireless communication system, the transmitter 12 and the receiver 15 may include modulators, demodulators, radio frequency upconverters and downconverters, and antennas, and the channel 20 may be a wireless communication channel.

In other embodiments, the system 10 can be a data transfer and/or storage system. In this scenario, the channel 20 is a solid state memory device such as a flash drive, SD (Secure Digital) card, EEPROM (Electrically Erasable Programmable Read-Only Memory), magnetic disk, optical disk (e.g., CD (Compact Disc), DVD (Digital Video Disc), Blue-Ray, etc.), magnetic tape, other type of non-volatile memory, or some other storage medium. The transmitter 12 writes digitized data to be stored or transferred onto the channel 20, and the receiver 15 reads the stored or transferred digitized data from the channel 20. Thus, the transmitter 12 may include a write channel to write data to the storage medium, and the receiver 15 may include a read channel to read data from the storage medium. The transmitter 12 may be included in a variety of devices, such as (but not limited to) a computer, a digital camera, a digital media recorder, or a wired or wireless communication device. Similarly, the receiver 15 may be included in a variety of devices such as (but not limited to) a computer, a digital camera, a digital media player, or a wired or wireless communication device. In some embodiments, the transmitter 12 and the receiver 15 are included in a single device.

Of course, the system 10 is not limited to a communications system, a computer data transfer system, or a computer data storage system, as discussed in the above illustrative examples. More generally, the system 10 may be included in any system in which data is encoded, transmitted and/or stored, received and decoded.

The encoder 22 and decoder 25 within the system 10 may typically (but are not required to) perform inverse operations so that original data is recovered at the receiver 15 with no errors, even when the channel 20 is unreliable. Generally, the encoder 22 applies error correction to the original data, and the decoder 25 decodes received data blocks in accordance to the applied error correction to recover the original data. Error correction coding techniques are commonly known, and may include systematic error correction coding (e.g., the original data is transmitted along with redundant or parity data) or non-systematic error correction coding (e.g., the original data is transformed into encoded data, and encoded data is transmitted). Embodiments of the present disclosure may operate in conjunction with any suitable error correction technique, scheme or strategy used by the encoder 22 and the decoder 25.

The transmitting device 12 is configured to consider an output constraint for data that is to be transferred over the channel 20. Likewise, the receiving device 15 is configured to consider the output constraint so that the original data can be recovered accordingly. The details of constraint consideration are described subsequently.

Figure 1B:
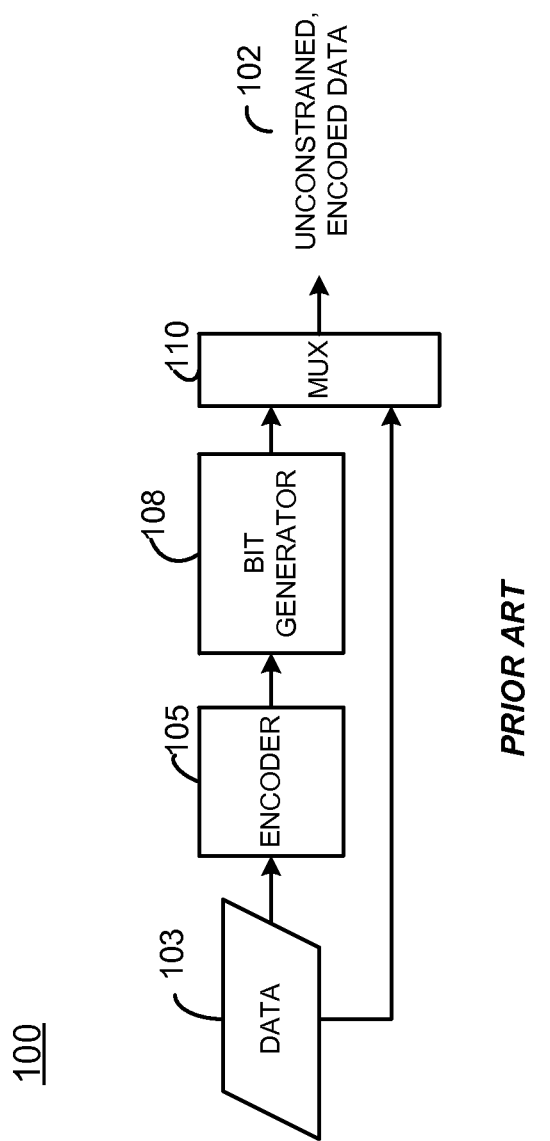
FIG. 1B is an example of a data flow where the output data does not meet a desired constraint.
Figure 1C:
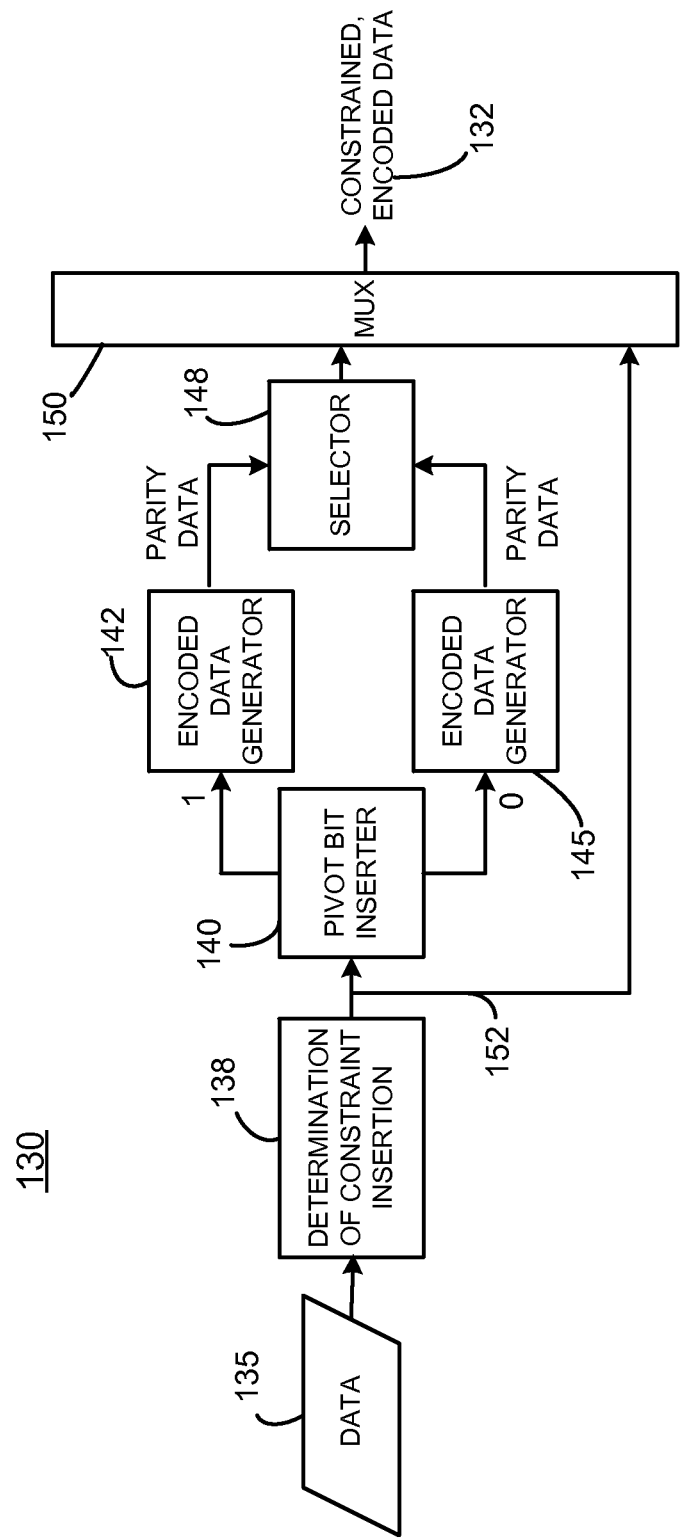
FIG. 1C is an example of a data flow where the output data meets a desired constraint.

FIG. 1B is a data flow diagram of an example of an encoder that generates output data that is not constrained. On the other hand, FIG. 1C is a data flow diagram of an example of an encoder that generates output data that is constrained. For illustrative purposes, the data flow diagrams in FIGS. 1B and 1C assume a systematic error correction code that generates parity data that is appended to a block of data. To aid in the understanding of the present disclosure, FIGS. 1B and 1C will be discussed with respect to the system 10 of FIG. 1A. In particular, the encoder 22 of FIG. 1A can implement the data flow diagram illustrated in FIG. 1C.

Turning first to FIG. 1B, the data flow 100 may produce encoded data 102 that does not meet a desired constraint. The encoded data is output by a transmitter and is transferred to a receiver over a channel. In communication systems, the encoded data may be multiplexed with other information onto a transmission channel such as a copper cable, an optical fiber, or a wireless channel, etc. In data transfer or storage systems, the encoded data may be written onto a computer-storage medium such as a flash memory, magnetic disk, optical disk magnetic tape, etc.

As used herein, the terms "constraint," "desired constraint," "desired output constraint," or "output constraint" are used interchangeably and refer to a desired condition or characteristic of the encoded data. The desired condition or characteristic of the encoded data may be based on the channel and/or the receiving device. For example, in some systems, data channel error statistics may depend on a data type (e.g., logical bit "0" or logical bit "1") that is transferred. In some systems, a data channel may prefer one data type over another for reliability purposes. One illustrative scenario of such a desired constraint on encoded data is when the channel is a flash memory device. Flash memory devices often prefer the logical bit "1" instead of the logical bit "0" as the logical bit "1" typically indicates program prohibition. Use of logical bit "1" may decrease stress during programming and may increase life expectancy for memory cells of the flash memory device. Thus, an example of a desired constraint on encoded data to be written to the flash memory device is to use the logical bit "1" more often than the logical bit "0".

In another example of a desired constraint on output data type, a communication system may desire the encoded data to have a Hamming weight that is equal to or greater than at least a minimum Hamming weight. The minimum Hamming weight is utilized to differentiate transmitted encoded data from auxiliary or nuisance data. In one example, the minimum Hamming weight may be utilized to differentiate one or more parity bits of transmitted encoded data from an all-zero vector.

Of course, desired constraints on the encoded data are not limited to the examples discussed above. Other suitable, desired constraints on the encoded data may be possible, and may be used in conjunction with the systems and methods of the present disclosure.

In FIG. 1B, however, the data flow 100 does not produce encoded data 102 that meets a desired output constraint, i.e., the encoded data 102 is unconstrained. In the example data flow 100, a systematic error correction code is used, and an error correction code (ECC) is applied by an encoder 105 to each of a plurality of blocks in the data 103. The error correction code (ECC) may be a systematic error correcting code, such as (but not limited to) data plus check-sum, Reed-Solomon, other BCH codes, etc. Based on the ECC applied by the encoder 105, one or more additional bits are generated by a bit generator 108 for each data block. The additional bits are redundant data, for example, parity data. The determined additional bit(s) are multiplexed (MUXed) by a multiplexer 110 with the original data, and then delivered as encoded data 102 to be transmitted over the channel 20. Note that in the data flow 100, no consideration is paid to any constraint on the encoded data 102, and thus the encoded data 102 is unconstrained.

FIG. 1C illustrates an example of a data flow 130 that produces constrained encoded data 132. Similar to the data flow 100 of FIG. 1B, a systematic ECC (Error Correction Code) is applied to each of a plurality of data blocks of the data 135. In the data flow 130, however, a desired constraint insertion is determined 138. The determination of the constraint insertion 138 may be based on, for example, a desired output data type, a desired minimum Hamming weight, or some other suitable condition or characteristic desired of the data to be delivered via the channel 20.

For example, consider a scenario where the desired constraint is a desired minimum Hamming weight for a systematic error correction code. The determination of the constraint insertion 138 is based on the error correction code property of minimum distances, e.g., error correction codes can successfully detect erroneous sequences that are at least dmin distant from the encoded bit sequence. In particular, for error correction codes with a minimum Hamming distance dmin between code vectors or words, a one bit change in a sequence of original information bits 135 translates into an at least dmin−1 flip in the required dmin parity bits appended to the original information bits. Accordingly, in the data flow 130 for this scenario, based on the determination of the constraint insertion 138, pivot data is added to the original data 135 by a pivot bit inserter 140 to generate parity that is at least dmin−1 away from an all-zero vector. The pivot data may include one or more pivot bits. Generally, based on the constraint insertion 138, the one or more pivot bits may be manipulated so that the desired constraint may be met by the output data.

The addition of pivot data corresponding to the desired constraint to each block of the data 135 by the pivot bit inserter 140 results in the formation of appended data blocks. The pivot data or one or more pivot bits each may be appended or inserted into the data block 135 at any suitable bit position, and are not required to be appended to the end of the data block 135. As used herein, the term "appending" refers to adding to the beginning or to the end of a block, or inserting within the block at one or more locations, or combinations thereof.

Each inserted pivot bit is assigned a "1" or a "0" value. For ease of explanation, the basic data flow 130 is described with only one pivot bit, but any suitable number of pivot bits may be used. The appended data block is encoded with one pivot bit value by an encoded data generator 142, and is separately encoded with the other pivot bit value by the same or a different encoded data generator 145. In the example illustrated by FIG. 1C, the encoded data generators 142, 145 are error correction encoders or ECC encoders (such as embodiments of encoder 22 of FIG. 1A) that apply error correction to data that is to be transmitted, however, other encoded data generators may be contemplated and used in conjunction with embodiments of the present disclosure.

The pivot bit value may indicate an application or an omission of a transformation to the data 135 to be performed in conjunction with the error correction coding at the blocks 142 and 145. The transformation can be any suitable mapping function that is applied to the data block. For example, a transformation can include simply appending the pivot bit(s) to the corresponding data block.

In another example, the transformation may be a masking function, for example, XOR-ing the data block with a mask of all "1"s, all "0"s, or a combination of "1"s and "0"s. For instance, if the pivot bit is assigned the "1" value, the original data 135 may be XOR-ed with a mask of all "1"s at the encoded data generator 142, and if the pivot bit is assigned the "0" value, the original data 135 may not be XOR-ed with the mask of all "1"s at the encoded data generator 145.

In yet another example, the transformation may be a swap function. In this example, if the pivot bit is assigned the "1" value, a first portion of the data 135 is swapped with a second portion of the data 135. If the pivot bit is assigned the "0" value, the original data 135 may remain unchanged. Of course, transformations are not limited to the examples described above. Other suitable transformations can be utilized and can be indexed by one or more pivot bits.

A selector 148 makes a selection between the parity data corresponding to the pivot bit of value "0" and the parity data corresponding to the pivot bit of value "1." The parity data that best meets the desired constraint may be selected by the selector 148, and the selected parity data is multiplexed at a multiplexer 150 with the original data 152. Thus, in this manner, the data flow 130 produces (for each block of data 135) encoded data 132 that meets the desired constraint or condition 138 in addition to maintaining the desired error correction strategy 142, 145 (e.g., calculation of parity, etc.). The encoded data 132 also may include an indication of the transformation that was performed (if performed). For example, the encoded data may include the pivot bit corresponding to the selection made at the selector 148. Note that in the data flow 130, the at least one pivot bit does not influence error correction coding of the data 135 (e.g., as performed by the encoded data generators 142, 145), but instead effects the generated parity of the encoded data (as selected by the selector 148) to have the desired constraint.

Although the data flow 130 of FIG. 1C is described with respect to systematic error correction codes, the data flow 130 can be modified to accommodate non-systematic codes as one of ordinary skill in the art will recognize in light of the discloser and teachings herein. With non-systematic codes, a data block is entirely encoded by the encoded data generator 142 and/or 145 and is output as constrained encoded data 132 without needing to be multiplexed 150 with the original data 152. In particular, for non-systematic error correction codes, the multiplexing block 150 may be omitted. In some examples, inserting pivot bits at block 140 may also be omitted, such as when a non-systematic error correction code itself determines parity to meet a desired constraint.

As previously discussed, in some embodiments, multiple pivot bits can be inserted by the pivot bit inserter 140. In the case of multiple pivot bits, each of the pivot bits can be separately assigned different values. In some embodiments, each of the multiple pivot bits may index a different transformation. In these embodiments, if multiple pivot bits are added to the original data 135, multiple transformations are applied to the original data 135 based on the values of the multiple pivot bits. In other embodiments, a first permutation/combination of multiple pivot bits and their values indexes a particular, single transformation, and different permutations/combinations of the multiple pivot bits and their values index corresponding different, transformations. Typically, but not necessarily, at the encoded data generators 142 and 145, the indicated transformation(s) may be applied prior to error correction. At the selector 148, a particular permutation of pivot bits and their values that is closest to the desired constraint may be selected from the multiple permutations.

In some embodiments, two separate ECC encoders 142, 145 (or multiple ECC encoders, in the case of multiple pivot bits) may not be necessary. In some embodiments, instead of computing each of n permutations or combinations of pivot bits in parallel by n ECC encoders, computing each of n permutations or combinations of pivot bits are sequentially performed by a single ECC encoder, and the pivot bit value(s) are modified for each computation. When a permutation or combination is discovered that meets the desired output constraint, it is selected by selector 148. In some embodiments, a combination of both sequential and parallel ECC computing is utilized.

Note that both the data flow 100 and the data flow 130 generate encoded data (102, 132, respectively) with a same number of parity bits. The data flow 130, however, constrains the parity bits so that the output data 132 meets or is close to the desired output constraint. Thus, with the same total number of parity bits, the data flow 130 produces output data that is better optimized for the data channel and/or the data receiver as compared with the data flow 100.

In some embodiments, the one or more ECC encoders 142, 145 utilize a linear, systematic ECC code (e.g., BCH code). For linear, systematic codes, only one ECC encoding operation for a first value of a pivot bit needs to be actively calculated for a particular data block. Due to linearity of the systematic ECC code, a transformation corresponding to an opposite value of the pivot bit may simply be computed via an XOR operation (i.e., "exclusive-or," denoted by the symbol "$\oplus$"). For example, consider an original data block that is BCH encoded and includes a single pivot bit appended at the end. In this example, parity bits corresponding to "000 . . . 001" may be pre-determined and stored, and may be represented as M. The parity bits X corresponding to the original data+0 are computed by the ECC encoder. Due to the linearity of BCH codes, the parity bits Y corresponding to the original data+1 can be computed by the expression: X XOR M. A selection between X and Y is then made at selector 148 to determine which is closer to the desired constraint.

Figure 2:
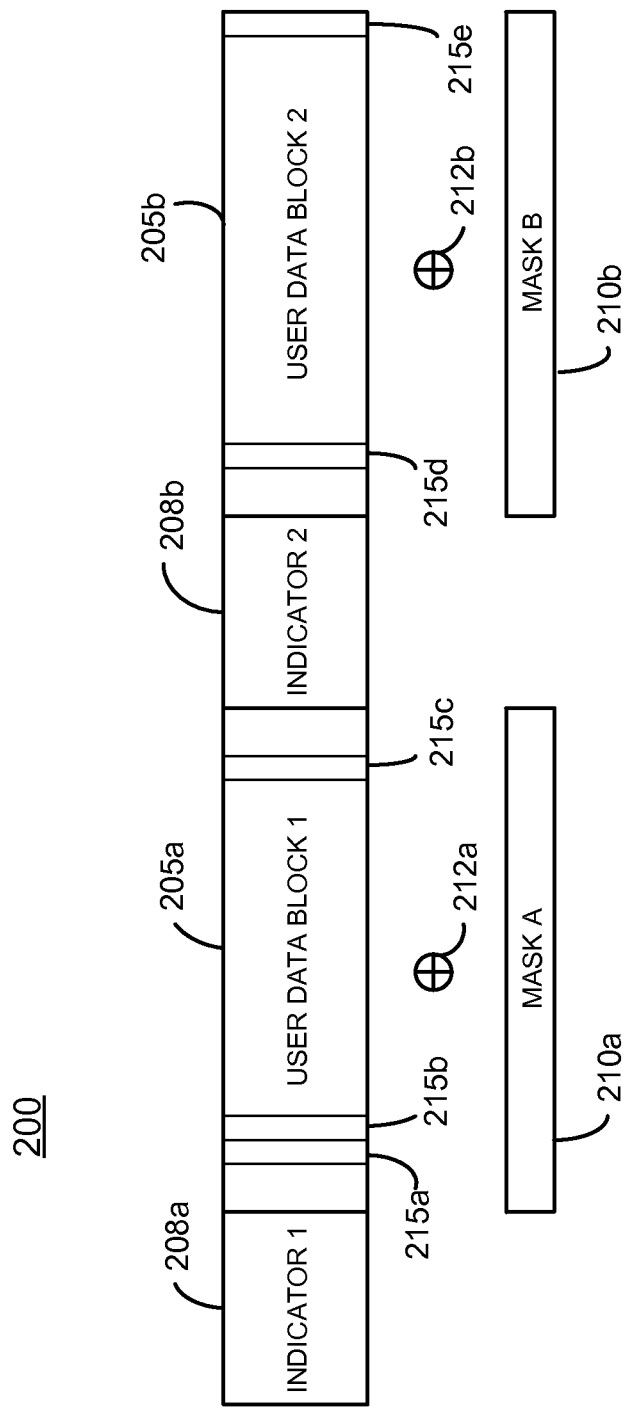
FIG. 2 illustrates an example of an output data stream that meets a desired constraint in a piece-wise manner.

In some embodiments, a same transformation is not applied to every data block of an original data stream. Instead, the data blocks corresponding to the original data stream are piece-wise constrained, where at least two different data blocks in the original data stream are transformed differently. Although different transformations can be applied to each data block, each data block individually meets the desired output constraint. FIG. 2 illustrates an example of an output data stream 200 that meets a desired output constraint in a piece-wise manner. The data stream 200 can be an output of the data flow 130 of FIG. 1C, and can be generated by the encoder 22 of FIG. 1A.

For brevity, the output data stream 200 illustrates only two blocks of data 205a, 205b, but any number of data blocks may be used. The data blocks 205a, 205b as shown in FIG. 2 are each encoded according to a same error correction coding scheme, but each is transformed according to a different transformation to satisfy an output constraint. Specifically, the data block 205a is transformed by a first combination of pivot bits (e.g., bits 215a, 215b and 215c) and their values, and the data block 205b is transformed by a different combination of pivot bits (e.g., bits 215d, 215e) and their values. Even though the two data blocks (205a, 205b) are transformed differently, both data blocks 205a, 205b still meet the desired output constraint. Of course, the first combination of pivot bits (215a, 215b and 215c) and the second combination of pivot bits (215d, 215e) shown in FIG. 2 are exemplary only, and any combination of any number of pivot bits in any bit positions may be included in each of the data blocks 205a, 205b.

Pre-pended to each data block 205a, 205b is a corresponding indicator block (208a, 208b, respectively). Each indicator block 208a, 208b may include a same number of bits (e.g., 12 bits, 8 bits, 4 bits, etc.) or a different number of bits. Each indicator block 208a, 208b indicates a different transformation that is applied to its corresponding data block 205a, 205b during encoding. When the decoder 25 begins to decode the data stream 200, it strips off the indicator bits 208a. Decoding corresponding to the applied encoding scheme at the transmitter 12 is performed, including stripping off any added pivot bits, so that the original data corresponding to user block 205a is recovered provided the channel has not introduced too many errors. Based on the indicator bits 208a, the decoder 25 applies an inverse of the transformation indicated by bits 208a to recover the original data block. Similarly, for the data block 205b, the indicator 208b is stripped off, decoding is performed, and an inverse of the transformation indicated by the indicator block 208b is applied to the data block 205b. A mapping of indicators to different transformations can be pre-defined and shared a priori between the transmitter 12 and the receiver 15, for example.

For embodiments in which the encoding/decoding scheme is linear and systematic, indicators such as indicators 208a, 208b may correspond to masks. For example, in FIG. 2, "Indicator 1" 208a corresponds to "Mask A" 210a, and "Indicator 2" 208b corresponds to "Mask B" 210b. The relationships between indicators 208a, 208b and masks 210a, 210b may be pre-defined and shared a priori between the transmitter 12 and the receiver 15, for example. In one implementation, each indicator may correspond to one particular mask. Alternatively, more than one different indicator may correspond to a same mask. As the encoding/decoding scheme is linear and systematic, the decoder 25 need only XOR (212a, 212b) each data block 205a, 205b with an appropriate mask 210a, 210b as indicated by the corresponding indicator 208a, 208b. In this manner, the decoder 25 may reverse the transformation that was applied by the encoder 22.

Figure 3:
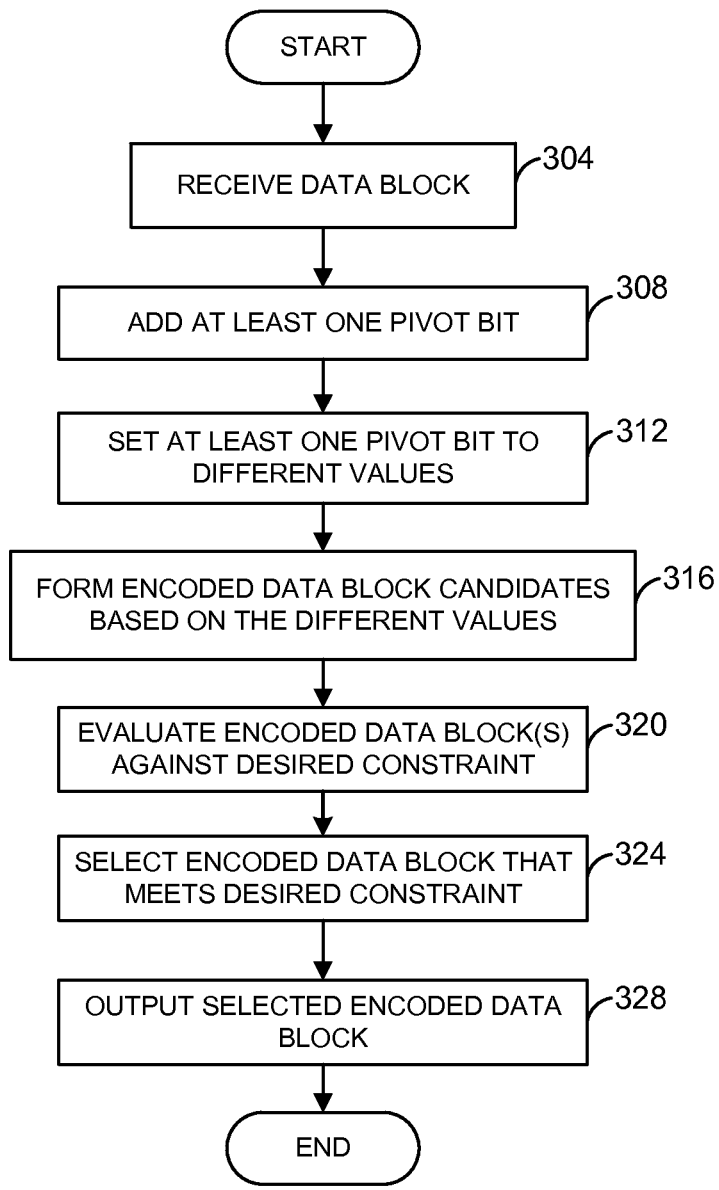
FIG. 3 is a flow diagram of an example of a method for encoding data to meet a desired constraint.

FIG. 3 is a flow diagram of an embodiment of a method 300 for encoding data to meet a desired output constraint. Embodiments of the method 300 may be used, for example, in conjunction with the system 10 of FIG. 1A, the data flow 130 of FIG. 1C, and the data blocks 200 of FIG. 2.

At 304, a data block is received. Different data blocks may be of the same length or of differing lengths.

At 308, at least one pivot bit is added to the received data block. The at least one pivot bit is inserted into at any suitable bit position in the original block (e.g., appended to the beginning, appended to the end, and/or inserted within). If more than one pivot bit is inserted, in some embodiments, some or all of the pivot bits are each inserted at different bit positions. In other embodiments, some or all of the pivot bits are inserted as a contiguous sub-block.

At 312, the added pivot bit(s) are set to different values, and at 316, the differently-valued pivot bits are used to form different encoded data block candidates. For example, if a single pivot bit is added, it is set to "1" and a first encoded data block candidate is generated. Also, the single pivot bit is set to "0" and a second encoded data block candidate is generated. If multiple pivot bits are added, various combinations of possible bit values for the multiple pivot bits are set, and corresponding encoded data block candidates are generated. For example, if two pivot bits are added, then a different encoded data block is generated for each of the pivot bit value combinations: 00, 01, 10, and 11.

In some embodiments, at 316 the original data block is transformed based on a value of the at least one pivot bit. In some embodiments, each pivot bit corresponds to a different transformation, where one value of the pivot bit may indicate "apply the transformation," and another value of the pivot bit may indicate "do not apply the transformation." In some embodiments, a particular combination of pivot bit values may correspond to a single particular transformation. In some embodiments, both individual and group pivot bit indications of transformations are used concurrently. For example, pivot bit A having a value of "1" may indicate flipping a quartile of the bits of the data block. Pivot bit B having a value of "1" may indicate XOR-ing bits with a mask of "1"s. Pivot bits C-F may each correspond to a particular quartile of the data block. If pivot bits A, C and D are all set to "1", the indicated transformation includes flipping the first quartile of the data block with the second quartile. If pivot bits B and F are set, the indicated transformation includes XOR-ing masking the last quartile of the data block with a mask of "1"s. Of course, these examples are only illustrative and other suitable transformations and combinations of transformations may be utilized.

At 316, multiple data block candidates can be generated in parallel, where a separate error correction block (e.g., multiple ECC blocks) generates each encoded data block candidate. Alternatively, each encoded data block candidate may be generated sequentially, where a same error correction block (e.g., a single ECC block) generates each encoded data block one at a time. In some embodiments, a combination of parallel and sequential generation of the set of data block candidates is utilized.

At 320, the encoded data block candidates are evaluated against a desired constraint. As previously discussed, a desired constraint is a desired condition or characteristic of the encoded data block. The desired condition or characteristic of the output data can be based upon the channel to be used and/or the receiving device, for example. Similar to 316, evaluating each encoded data block candidate against the desired constraint 320 may be performed in parallel, sequentially, or combination of parallel and sequential.

At 324, a particular encoded data block candidate that meets the desired constraint is selected. In some embodiments, an encoded data block candidate that best meets the desired constraint is selected from all possible encoded data block candidates after all have been evaluated 320. In some embodiments, an encoded data block candidate that sufficiently (but perhaps not optimally) meets the desired constraint is selected without evaluating 320 each and every candidate. For example, if encoded data block candidates are evaluated sequentially at 320, a first encoded data block candidate that meets the desired constraint is selected at 324, and any remaining candidates are not evaluated after the selection of the first, sufficiently constrained encoded data block candidate.

At 328, the selected encoded data block (or in other words, the encoded, constrained original data block) is output. For example, in a wireless communication system, the selected encoded data block may be sent to a transmit path for modulation and transmission via an antenna or antennas. In a data storage system, the selected encoded data block is sent to a write channel for writing the encoded data to a storage medium.

One of ordinary skill will appreciate that the method 300 is executed for each data block that is desired to be transmitted. For example, the method 300 operates on a first data block, and then again on each subsequent data block until all data blocks corresponding to a totality of the data has been constrained, encoded and output.

One of ordinary skill will also appreciate that the method 300 may be easily adapted when more than one constraint is desired to be met. For example, a first pass of the method 300 may be executed on a particular data block to meet a first desired constraint. Then, a second pass of the method 300 may be executed on the same data block to meet a next desired constraint. In another example, a single pass of the method 300 may be executed on the particular data block, but 320 may evaluate encoded data blocks against all desired constraints simultaneously. Other adaptations of the method 300 to accommodate multiple desired constraints will be appreciated by one of ordinary skill in the art in view of the disclosure and teachings herein.

The method 300 can be utilized in conjunction with systematic or non-systematic error correction codes. In embodiments that include systematic codes, the method 300 includes multiplexing parity data with the original data block (not shown in FIG. 3), such as illustrated by 150, 152 of FIG. 1C.

Figure 4:
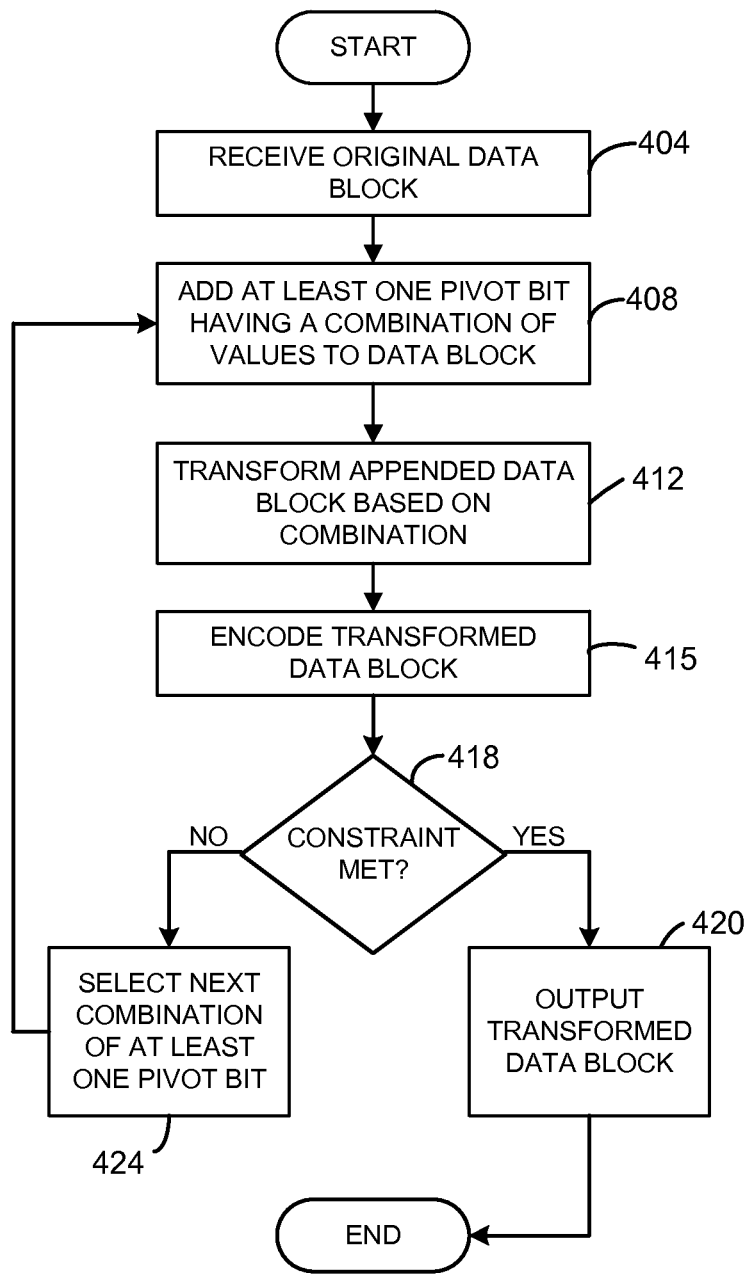
FIG. 4 is a flow diagram of another example of a method for encoding data to meet a desired constraint.

FIG. 4 is a flow diagram of an embodiment of a method 400 for encoding data to meet a desired constraint. The method 400 may be used, for example, in conjunction with the system 10 of FIG. 1A, the data flow 130 of FIG. 1C, and the data blocks 200 of FIG. 2.

At 404, an original data block is received.

At 408, at least one pivot bit is added to the originally received data block to form an appended data block. The at least one pivot bit has a combination of at least one value corresponding to a transformation.

At 412, the appended data block is transformed according to the transformation corresponding to the value(s) of pivot bit(s) added at 408. Similar to the discussion of FIG. 1C, in some embodiments, each pivot bit may correspond to a different transformation, where one value of the pivot bit may indicate "apply the transformation" and another value of the pivot bit may indicate "do not apply the transformation." In some embodiments, a particular combination of pivot bits and their associated values may correspond to a single particular transformation. In some embodiments, both individual and group pivot bit indications of transformations may be used concurrently.

At 415, an error correction code is applied to the transformed data block. Any suitable error correction code may be applied at 415, such as systematic error correction codes (e.g., data plus checksum, BCH, Reed-Solomon, etc.) or non-systematic error correction codes (e.g., non-systematic convolutional codes, rateless erasure codes or fountain codes such as Raptor, among others).

At 418, it is determined whether or not a desired constraint is met by the encoded data block. If the encoded data block meets the desired constraint (as determined at 418), it is output to be transmitted 420 and the method 400 ends. If the encoded data block does not meet the desired constraint (as determined at 418), a different combination of pivot bit(s) and/or pivot bit value(s) is selected at 424. Then, the flow reverts back to the 408. In this fashion, the method 400 includes potentially repeatedly inserting various combinations of pivot bit(s) into the original data block and evaluating the resulting encoded data block until a combination of pivot bit(s) is discovered that sufficiently meets the desired constraint (e.g., the condition at 418 is fulfilled). Upon its discovery, the particular encoded data block is output at 420 as it is sufficiently constrained to meet the desired condition, and the method 400 ends.

Similar to the method 300, the method 400 may be applied afresh to each data block that is desired to be transmitted. For example, the method 400 may operate on a first data block, and then again on each subsequent data block.

Also, the method 400 may be adapted to scenarios where multiple desired output constraints are desired. For example, at 418 each encoded data block may be evaluated against all desired output constraints simultaneously, for example. Other adaptations for multiple desired output constraints will be recognized by one of ordinary skill in the art in view of the disclosure and teachings herein.

Note that the method 400 may not ensure that the transmitted, constrained data at 420 is the most optimally constrained data block. If a system desires optimization of a constraint, embodiments of the method 300 may be more appropriate as a larger set of potential encoded data block candidates may be considered prior to selection. If a system desires its constrained output to be "good enough," the method 400 may be used. Clearly, a tradeoff may exist between a cost and time of processing vs. a level of optimization of constrained data output.

Figure 5:
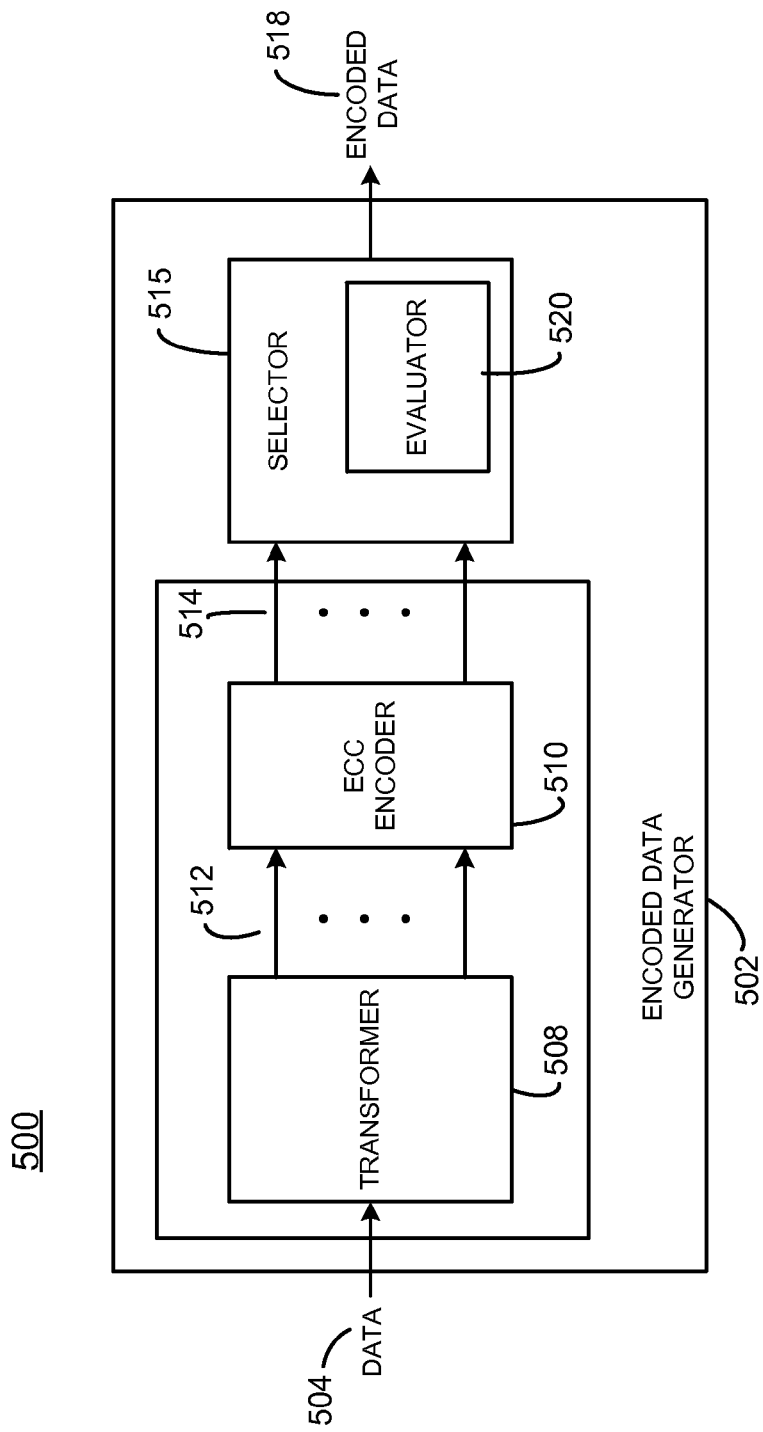
FIG. 5 illustrates an embodiment of an apparatus for encoding data to meet a desired constraint.

FIG. 5 is a block diagram of an embodiment of an apparatus 500 for encoding data to meet a desired output constraint. Embodiments of the apparatus 500 may operate in conjunction, for example, with the system 10 of FIG. 1A, the data flow 130 of FIG. 1C, the data blocks 200 of FIG. 2, the method 300 of FIG. 3 and/or the method 400 of FIG. 4. For example, the apparatus 500 may be implemented in the encoder 22 of a transmitter 12 using a processor executing software instructions, a processor executing firmware instructions, hardware or some combination thereof.

The apparatus 500 includes an encoded data generator 502 that receives data 504 and generates a plurality of different encoded candidates 514 based on the data 504. The encoded data generator 502 includes a transformer 508, such as a data transformer, and an ECC encoder 510. The transformer 508 generates at least one transformed version 512 of the data 504. In one embodiment, transformer 508 includes a pivot bit inserter (not shown) configured to add one or more pivot bits to the data 504, and to output transformed versions 512 that includes different values of the one or more pivot bits. The one or more pivot bits may be added as a contiguous block into the data 504, the one or more pivot bits may be individually inserted into any suitable bit position including at the beginning, at the end, or within the data 504, or a combination of contiguous and non-contiguous bit positions may be used. The pivot bit inserter assigns a value of "1" or "0" to each pivot bit, and outputs the transformed versions 512 to the ECC encoder 510. The one or more combinations of pivot bits may each have a same or different number of total bits. Furthermore, the values of the pivot bits differ across the one or more combinations of appended data. For example, the pivot bit inserter may output a first combination of appended data that includes the original data 504 appended with a contiguous block of three pivot bits that are each set to the bit value "1," and the pivot bit inserter may output a second combination of appended data of the original data 504 with five added pivot bits, one pivot bit inserted at every second bit position, where every other of the five added pivot bits is set to the bit value "1."

In some embodiments, a pivot bit or combination of pivot bits corresponds to a transformation to be performed on the data 504 by the transformer 508, where a pivot bit value of "1" indicates "apply the transformation" and a pivot bit value of "0" indicates "do not apply the transformation." Examples of possible transformations may include those discussed with respect to FIG. 1C.

The transformed versions 512 are provided to the ECC encoder 510. In some embodiments, the ECC encoder 510 is a single ECC encoder, and each of the combinations of appended data output from the transformer 508 is passed sequentially to the single ECC encoder 510. In other embodiments, the ECC encoder 510 includes multiple single ECC encoders operating in parallel, and at least some of the transformed versions 512 are provided in parallel to the multiple ECC encoders 510.

The ECC encoder 510 applies any suitable error correction coding. Different encoded candidates 514 corresponding to different pivot values are generated by the ECC encoder 510. In some embodiments, the ECC encoder 510 may use a systematic error correction code so that each encoded candidate 514 includes the original data 504 and parity data. In other embodiments, the ECC encoder 510 may use a non-systematic error correction code.

In another embodiment, the order of the transformer 508 and the ECC encoder 510 may be reversed. As discussed above, the data 504 may be encoded, and then different encoded candidates 514 can be generated by transforming the ECC encoded data. Thus, in this embodiment, a pivot bit inserter may insert one or more pivot bits into the data 504, each with a value of zero for example, and the ECC encoder 510 generates an encoded version of the data 504 appended with the one or more pivot bits. The transformer 508 can then transform the encoded version of the data 504 appended with the one or more pivot bits into a plurality of encoded candidate 514 corresponding to different values of the one or more pivot bits.

The ECC encoder 510 delivers the different encoded candidates 514 to a selector 515. The different encoded candidates 512 can be delivered sequentially, in parallel, or a combination of sequential and parallel delivery.

The selector 515 is configured to select one of the different encoded candidates 514 to output as encoded data 518 to be transmitted. In one embodiment, the selector 515 includes an evaluator 520 configured to calculate a measurement for use by the selector 515 to compare the different encoded candidates 512. Generally, the calculations performed by the evaluator 520 provide a measurement related to the desired constraint on output data. For example, the evaluator 520 may calculate a distance between each candidate 512 and a desired Hamming weight. In another example, the evaluator 502 may calculate a total number of "1"s in each candidate 512. Other suitable measurements or calculations may be determined by the evaluator 520.

Based on the measurements determined by the evaluator 520 or on some other selection criteria, the selector 515 determines a most suitable candidate from the candidates 512 and outputs the encoded data 518 to be transmitted. Typically, the most suitable candidate is the candidate that meets or is closest to the desired output constraint.

The methods of FIGS. 3 and 4 and the apparatus of FIG. 5 may be implemented using hardware, a processor executing firmware instructions, a processor executing software instructions, or any combination thereof. When the methods of the present disclosure are implemented using a processor that executes firmware and/or software computer-executable instructions, the software or firmware instructions may be stored in a memory associated with the processor. More generally, the software or firmware instructions may be stored in any computer readable storage medium such as on a magnetic disk, an optical disk, or other storage medium, in a RAM or ROM or flash memory, processor, tape drive, etc. Likewise, the software or firmware may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware may include machine readable instructions that are capable of causing one or more processors to perform various acts.

When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, changes, additions or deletions in addition to those explicitly described above may be made to the disclosed embodiments without departing from the scope of the invention.

What is claimed is:

1. An error correction encoding apparatus, comprising:
   an encoded data generator configured to generate a plurality of different encoded candidates for a received data block, wherein
      each different encoded data block includes an encoding of a respective appended data block, the respective appended data block including the received data block and a respective set of pivot data that is at least one of (i) appended to or (ii) inserted into the received data block, and each respective set of pivot data is based on a constraint on encoded data to be transmitted; and a selector configured to select, based on the constraint, one of the plurality of different encoded candidates to output as encoded data based on the constraint.

2. The error correction encoding apparatus of claim 1, wherein the encoded data generator comprises at least one of:
(i) a transformer configured to apply at least one transform to the received data block, and an error correction code (ECC) encoder configured to apply error correction to the transformed, received data block, or
(ii) the ECC encoder configured to apply error correction to the received data block, and the transformer configured to generate the plurality of different encoded candidates based on the encoded version of the received data block.

3. The error correction encoding apparatus of claim 2, wherein the ECC encoder is further configured to generate the plurality of different encoded candidates.

4. The error correction encoding apparatus of claim 3, wherein the ECC encoder comprises a single ECC encoder that is configured to operate sequentially on data blocks.

5. The error correction encoding apparatus of claim 3, wherein the ECC encoder comprises a plurality of single ECC encoders, the plurality of single ECC encoders configured to operate on data blocks in parallel.

6. The error correction encoding apparatus of claim 1, further comprising a pivot bit inserter configured to (i) generate the respective set of pivot data and (ii) at least one of (a) append the respective pivot data to the received data block or (b) insert the respective pivot data into the received data block.

7. The error correction encoding apparatus of claim 1, wherein values of the each respective set of pivot data respectively correspond to different transformations.

8. The error correction encoding apparatus of claim 7, wherein a first value of the each respective set of pivot data corresponds to an application of a particular transformation to the each different encoding block or to the respective appended data block.

9. The error correction encoding apparatus of claim 8, wherein a second value of the each respective set of pivot data corresponds to an omission of the particular transformation from the each different encoding block or to the respective appended data block.

10. The error correction encoding apparatus of claim 8, wherein the particular transformation is a first particular transformation, and wherein a second value of the each respective set of pivot data corresponds to an application of a second particular transformation to the each different encoding block or to the respective appended data block.

11. The error correction encoding apparatus of claim 8, wherein the particular transformation is at least one of an exclusive OR operation or a bit swapping operation.

12. The error correction encoding apparatus of claim 1, wherein the encoded data generator comprises a pivot bit inserter configured to (i) generate the respective set of pivot data, and (ii) at least one of (a) append the respective pivot data to the received data block, or (b) insert the respective pivot data into the received data block.

13. An apparatus, comprising:
a transmitter configured to transmit encoded data via a channel, wherein the transmitter comprises:
an encoded data generator configured to generate a plurality of different encoded candidates for a received data block, wherein
each different encoded data block includes an encoding of a respective appended data block including the received data block and a respective set of pivot data that is at least one of (i) appended to or (ii) inserted into the received data block, and
each respective set of pivot data is based on a constraint on encoded data to be transmitted; and
a selector configured to select, based on a constraint associated with at least one of the channel or a receiving device, one of the plurality of different encoded candidates to output as encoded data.

14. The apparatus of claim 13, wherein the channel comprises a communication channel; and
wherein the transmitter includes a modulator to modulate the encoded data for transmission via the communication channel.

15. The apparatus of claim 13, wherein the channel comprises a computer readable storage medium; and wherein the transmitter includes a write channel to write the encoded data to the computer readable storage medium.

16. The apparatus of claim 13, wherein the encoded data generator comprises:
a transformer configured to apply at least one transform to the received data block; and
an error correction code (ECC) encoder configured to apply error correction to the transformed, received data block.

17. The apparatus of claim 13, wherein the encoded data generator comprises:
an ECC encoder configured to apply error correction to the received data block; and
a transformer configured to generate the plurality of different encoded candidates based on the encoded version of the received data block.

18. The apparatus of claim 13, wherein values of the each respective set of pivot data respectively (i) correspond to different transformations, and (ii) indicate whether each different transformation is (a) to be applied or (b) to be omitted to the each different encoded data block or to the respective appended data block.

19. The apparatus of claim 13, wherein a particular transformation included in the different transformations includes at least one of an exclusive OR operation or a bit swapping operation.

20. The apparatus of claim 13, wherein the constraint on encoded data to be transmitted is based on the constraint associated with at least one of the channel or the receiving device.

* * * * *